United States Patent [19]

Sugihara et al.

[11] Patent Number: 5,059,585
[45] Date of Patent: Oct. 22, 1991

[54] METHOD OF MAKING A SPUTTERING TARGET FOR A BISMUTH BASED SUPERCONDUCTOR

[75] Inventors: Tadashi Sugihara; Takuo Takeshita; Yukihiro Ohuchi, all of Saitama, Japan

[73] Assignee: Mitsubishi Metal Corporation, Tokyo, Japan

[21] Appl. No.: 341,190

[22] Filed: Apr. 21, 1989

[30] Foreign Application Priority Data

Apr. 21, 1988 [JP] Japan .................................. 63-98942

[51] Int. Cl.$^5$ .............................................. H01L 39/12
[52] U.S. Cl. .......................................... 505/1; 264/60; 505/725
[58] Field of Search ..................... 505/1, 731, 739, 782, 505/730, 725; 264/62, 60, 61; 204/298, 192.1; 427/62

[56] References Cited

U.S. PATENT DOCUMENTS 4,920,094  4/1990  Nogawa et al. .................... 505/1

OTHER PUBLICATIONS

Nakao et al, "Magnetron Sputtering of Bi–Ca–Sr–Cu–O Thin Films with Superconductivity above 80K" *Jap Journ App Phys* 3/1988.

*Primary Examiner*—James Lowe
*Assistant Examiner*—Christopher A. Fiorilla
*Attorney, Agent, or Firm*—Sughrue,Mion,Zinn,Macpeak & Seas

[57] ABSTRACT

A method for fabricating a low resistivity target for sputtering a bismuth-calcium-strontium-copper oxide superconductor. The method includes the steps of: preparing ingredient powders of a calcium carbonate, a strontium carbonate and a copper oxide; producing a porous bulk body of a complex oxide from the ingredient powders; and impregnating molten bismuth into the porous bulk body of the complex oxide.

15 Claims, 3 Drawing Sheets

5,059,585

METHOD OF MAKING A SPUTTERING TARGET FOR A BISMUTH BASED SUPERCONDUCTOR

FIELD OF THE INVENTION

This invention relates to a target used in sputtering system and, more particularly, to a process of fabricating a target of a superconductive oxide of the bismuth-calcium-strontium-copper oxide system.

BACKGROUND OF THE INVENTION

Recently, a superconductive oxide of the bismuth-calcium-strontium-copper oxide system was proposed, and research and development efforts have been made for target formed of the superconductive oxide, because the sputtering technique is an attractive process for formation of a superconductive thin film in various practical applications.

A typical example of the process of fabricating the target starts with preparation of ingredient powders of the bismuth oxide (represented by the molecular formula of $Bi_2O_3$), the calcium carbonate (represented by the molecular formula of $CaCO_3$), the strontium carbonate (represented by the molecular formula of $SrCO_3$) and a copper oxide (represented by the general formula of $CuO$). These ingredient powders are mixed in a predetermined proportion to produce a mixture, and the mixture is calcined at 700 degrees to 800 degrees centigrade for a predetermined time period. The product is then pulverized. These steps, i.e., the calcining and the pulverizing are repeated two or three times, and a powder of the superconductive oxide of the bismuth-calcium-strontium-copper oxide system is finally obtained. The powder of the superconductive oxide is molded by using a usual pressing technique and, thereafter, sintered to produce a target. The powder of the superconductive oxide may be alternatively shaped by using a hot pressing technique to form the target.

However, a problem is encountered in the target produced through the prior art process in that cracks are much more liable to take place in the target during the sputtering. This is because of the fact that the superconductive oxide of the bismuth-calcium-strontium-copper oxide system has low thermal conductivity. Since the target is cooled off at one surface thereof and subjected to the bombardment of plasma at the opposite surface during the sputtering, a large difference in temperature takes place between both surfaces due to the low thermal conductivity. The large difference in temperature is causative of a thermal stress and, accordingly, the cracks. Thus, the prior art target suffers from a relatively short life time, which increases the production cost of a thin superconductive film.

Another problem inherent in the prior art target is a low electric resistivity. Therefore an expensive RF sputtering system is necessary for the prior art target, and a DC diode sputtering system is hardly usable. The expensive RF sputtering system also increases the production cost of the thin superconductive film.

Still another problem inherent in the target fabricated through the prior art process is low mechanical strength, and, for this reason, the prior art target is liable to be broken by ill usage. This also decreases the life time of the target and, accordingly, increases the production cost of the thin superconductive film.

The prior art target has still another problem; a relatively low critical temperature or a zero-resistivity temperature.

SUMMARY OF THE INVENTION

It is therefore an important object of the present invention to provide a process through which a target with a large thermal conductivity is fabricated.

It is also an important object of the present invention to provide a process through which a target with a low resistivity is fabricated.

It is also an important object of the present invention to provide a process through which a target with high mechanical strength is fabricated.

It is still another important object of the invention to provide a process through which a target with a relatively high critical temperature is fabricated.

To accomplish these objects, the present invention proposes to impregnate a complex oxide of the calcium-strontium-copper oxide system with molten bismuth. The target thus fabricated contains the metal bismuth which is operative to increase the thermal conductivity as well as the electrical conductivity.

In accordance with the present invention, there is provided a process of fabricating a target used in a sputtering system, comprising the steps of: a) preparing ingredient powders of a calcium carbonate, a strontium carbonate and a copper oxide; b) producing a porous bulk body of a complex oxide from the ingredient powders, the complex oxide being of the calcium-strontium-copper oxide system; and c) impregnating molten bismuth into the porous bulk body of the complex oxide.

BRIEF DESCRIPTION OF THE DRAWINGS

The features and advantages of a process of fabricating a target according to the present invention will be more clearly understood from the following description taken in conjunction with the accompanying drawings in which.

DESCRIPTION OF THE PREFERRED EMBODIMENTS

First embodiment

Description is hereinunder made for a process of fabricating a target formed of a superconductive oxide of the bismuth-calcium-strontium-copper oxide system with reference to FIGS. 1 to 6. FIGS. 1 to 6 merely show the process sequence in a modeled form.

Figure 1:
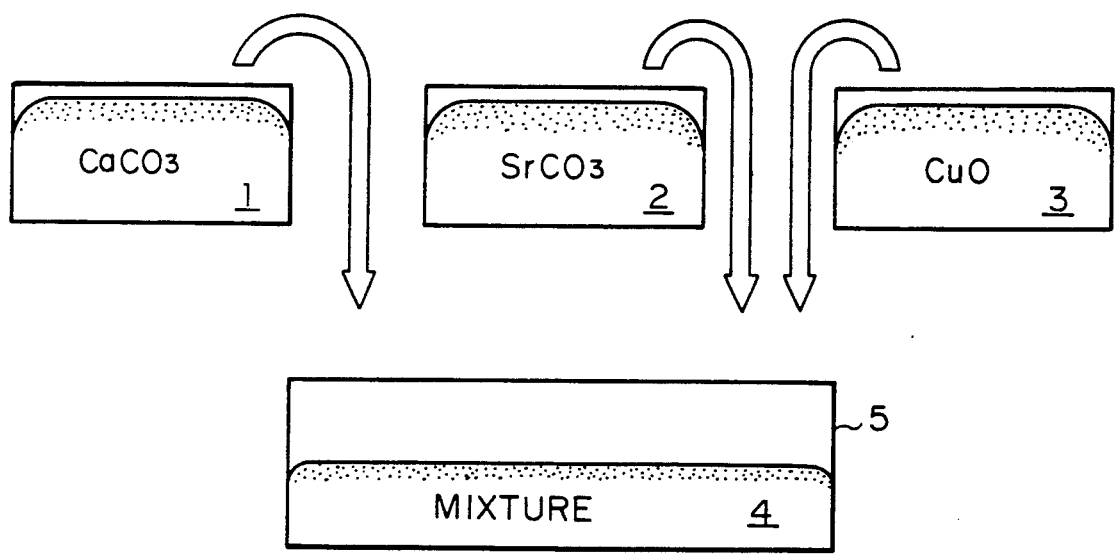
FIGS. 1 to 6 are views showing, in a modeled form, a process sequence for fabricating a target according to the present invention.

The process sequence starts with preparation of ingredient powders 1, 2 and 3 of the calcium carbonate (represented by the molecular formula of $CaCO_3$, the strontium carbonate (represented by the molecular formula of $SrCO_3$) and a copper oxide (represented by the general formula of $CuO$). These ingredient powders 1, 2 and 3 are about 7 microns in average diameter and not lower in purity than about 99.9 %. The ingredient powders 1, 2 and 3 are mixed to respective proportions indicated in Table 1 as shown in FIG. 1. Each of the mixing operations is carried out in moisture by using a ball-mill for three hours, and each mixture 4 of the ingredient powders is dried thereafter.

Figure 2:
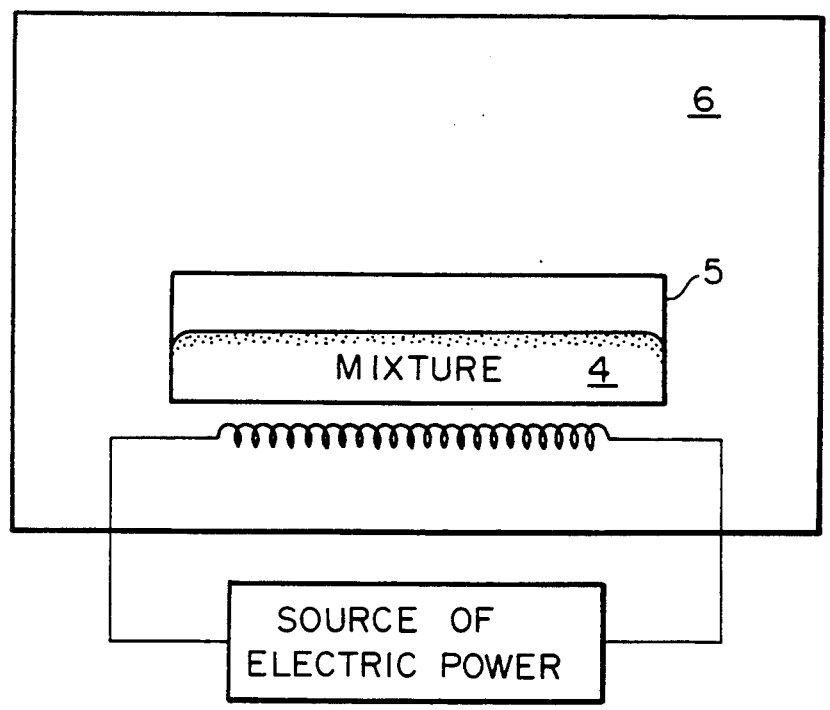
Figure 3:
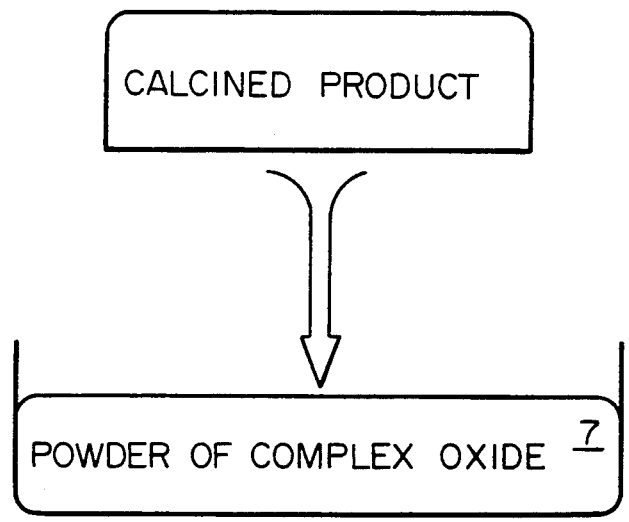

Each of the mixtures 4 is poured into an alumina vessel 5, and the alumina vessel 5 is placed in a furnace chamber 6 where a high temperature ambient atmosphere is created. The mixtures are calcined at respective high temperatures indicated in Table 1 for about 5 hours to produce bulk solids of complex oxides as shown in FIG. 2, and the complex oxides are of the calcium-strontium-copper oxide system. The bulk solids of the complex oxides are respectively pulverized into powders 7 by using a ball-mill as illustrated in FIG. 3, and the powders 7 of the complex oxides are respectively referred to as "samples 1 to samples 6" in Table 1 depending upon the proportion of the mixtures. The average diameters of the powders are shown in Table 1. However, if the average diameter ranges between about three microns and about 15 microns, the powders 7 are acceptable.

The temperature for the calcining should fall within a range between about 850 degrees and about 1050 degrees centigrade. If the mixture is calcined at a low temperature below about 850 degrees centigrade, the carbonates are not effectively decomposed, and, accordingly, a substantial amount of carbon is left in the complex oxides. If the complex oxides contain the carbon, a superconductive oxide produced therefrom merely shows a relatively low critical temperature. On the other hand, if the calcining is carried out above about 1050 degrees centigrade, the copper oxide tends to be melted, and, for this reason, the calcined product is out of the calcium-strontium-copper oxide system.

Figure 4:
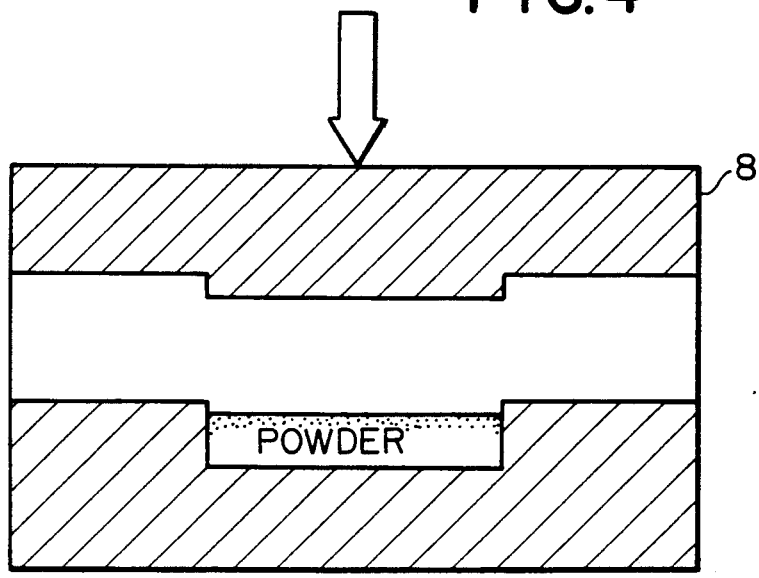
Figure 5:
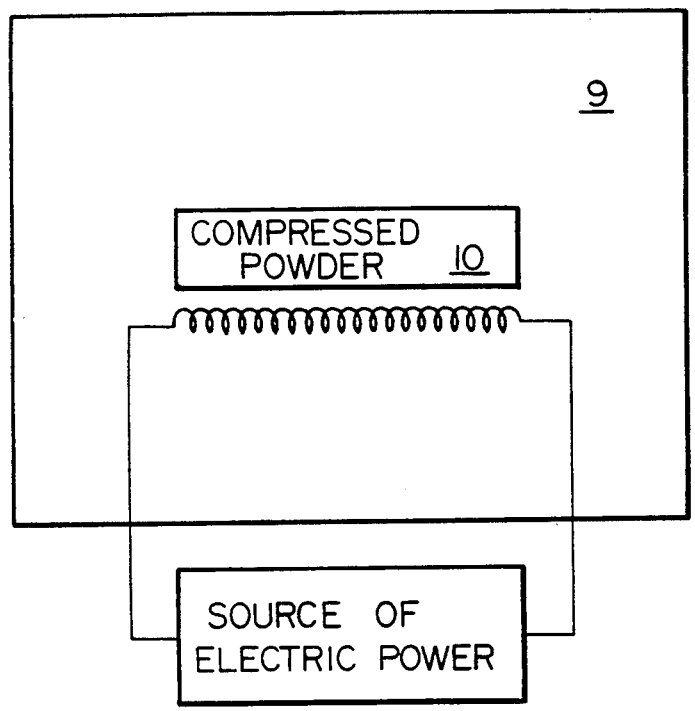

As illustrated in FIG. 4, the powders 7 are pressurized at about 2 tons per square centimeter by using a pressing machine 8 to produce bulks of compressed powders 10, respectively, and each bulk of the compressed powder 10 is placed in a furnace chamber 9 where a high temperature ambient atmosphere is created. The bulks of the compressed powders 10 are heated to respective temperatures indicated in Table 1 for about five hours, thereby being subjected to sintering as shown in FIG. 5. The sintered products 11 have a generally disk shaped configuration which is about 50 millimeters in diameter and about 10 millimeters in thickness. The sintered products 11 are porous and of the calcium-strontium-copper oxide system, and, for this reason, the sintered products 11 are hereinunder referred to as "porous oxide".

Figure 6:
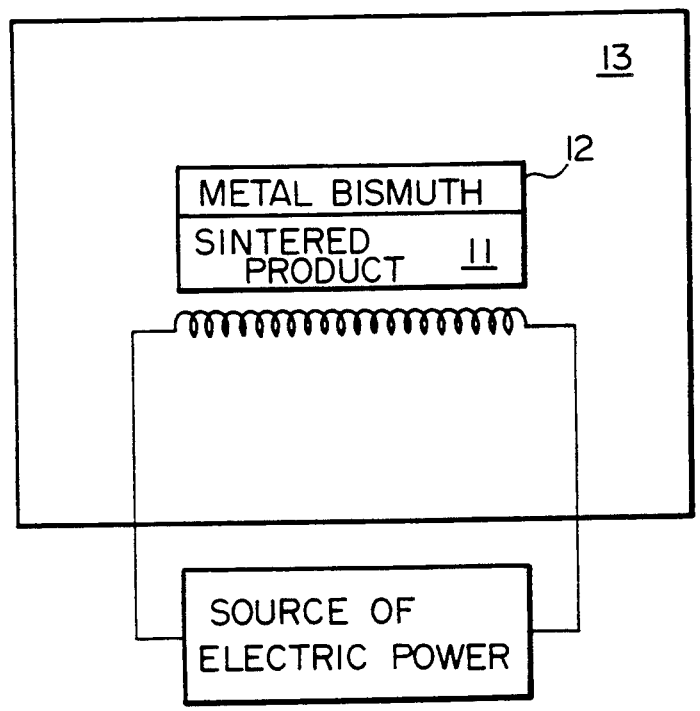

Bismuth films 12 are mounted on the bulk bodies of the porous oxides 11, respectively, and placed in a furnace chamber 13 as shown in FIG. 6. The furnace chamber 13 is heated to about 300 degrees centigrade and maintained for about three hours. In the high temperature furnace chamber 13, the bismuth films 12 are melted and impregnate the porous oxides 11, respectively. Upon the impregnation with the molten bismuth, the porous oxides 11 are converted into superconductive oxides of the bismuth-calcium-strontium-copper oxide system, respectively, and, accordingly, targets of the superconductive oxides are finally produced. In order to melt the metal bismuth, the furnace chamber is heated to about 300 degrees, however, it is acceptable to heat u the furnace chamber to equal to or greater than the melting point of bismuth which is about 272 degrees centigrade.

Second embodiment

Another process sequence according to the present invention is similar to that of the first embodiment with the exception of the target formation stage, and, for this reason, no description is made for the stages from the preparation to the formation of the powders of the complex oxides 7 which correspond to FIGS. 1 to 3.

The powders of the complex oxides 7 are subjected to hot pressing treatments at about 150 kilograms per square centimeter for about three hours in high temperature ambient atmospheres ambients, respectively, and the temperatures of the ambient atmospheres ambients are indicated in Table 1. The powders of the complex oxides are shaped into a generally disk shaped configuration which is about 50 millimeters in diameter and about 10 millimeters in thickness, thereby producing bulk bodies of the complex oxides, respectively. The bulk bodies of complex oxides are also porous and of the calcium-strontium-copper oxide system. Then, bismuth films are mounted on the bulk bodies of the complex oxides and heated to not less than about 272 degrees centigrade. Then, the metal bismuth films are melted and impregnate the porous complex oxides, respectively. Thus, targets of the superconductive oxides are fabricated through the process sequence. In this instance, the hot pressing is carried out in the ambient atmosphere ambient, however, another example may be hot pressing in a vacuum or an argon atmosphere:

TABLE 1

| Sample | Proportion (wt. %) | | | Calcine (°C.) | Average diameter (micron) | Process | Temp. (°C.) |
| --- | --- | --- | --- | --- | --- | --- | --- |
| | $CaCO_3$ | $SrCO_3$ | CuO | | | | |
| 1 | 24.5 | 36.3 | 39.1 | 850 | 7.1 | sintering | 800 |
| | | | | | | hot press | 550 |
| 2 | 28.3 | 41.7 | 30.0 | 920 | 5.5 | sintering | 850 |
| | | | | | | hot press | 600 |
| 3 | 27.5 | 40.2 | 32.5 | 990 | 3.0 | sintering | 1040 |
| | | | | | | hot press | 980 |
| 4 | 24.6 | 36.5 | 39.1 | 1050 | 6.0 | sintering | 1000 |
| | | | | | | hot press | 800 |
| 5 | 27.3 | 40.2 | 32.5 | 960 | 13 | sintering | 980 |
| | | | | | | hot press | 900 |
| 6 | 24.6 | 36.3 | 39.1 | 950 | 6.5 | sintering | 900 |
| | | | | | | hot press | 700 |

Evaluation

For comparison use, a target is fabricated through a prior art process as follows. The ingredient powders 1, 2 and 3 as well as a powder of the bismuth oxide (represented by the molecular formula of $Bi_2O_3$) are prepared and mixed to the proportion of 15.6% ($CaCO_3$), 23.1%($SrCO_3$), 24.9% (CuO) and 36.4%($Bi_2O_3$) by weight. The mixing operation is continued over five hours, and the mixture is dried thereafter. The mixture is calcined in an ambient atmosphere at about 800 degrees centigrade for about ten hours and, then, pulverized into a powder. The calcining and the pulverization are repeated five times to form a powder of a superconductive oxide of the Bismuth-calcium-strontium-copper oxide system. The powder of the superconductive oxide is shaped at 2 tons per square centimeter to produce a bulk body of a compressed powder by using a press machine, and the bulk body of the compressed powder is sintered in an ambient atmosphere ambient at about 850 degrees centigrade for about ten hours, then a disk shaped target is produced. The diameter of the disk shaped target is about 50 millimeters and the thickness thereof is about 10 millimeters.

The thermal conductivities are measured for the targets produced through the processes of the present invention as well as the prior art example, and the amount of metal bismuth impregnated is also measured for each of the targets of the present invention. The electric resistivities and the flexural strengths are measured for all of the targets. The results are summarized in Table 2.

In order to decide the respective critical temperatures, all of the targets are successively set into a dc magnetron sputtering system, an argon atmosphere is created in the sputtering chamber and regulated to about $10^{-2}$ torr. Substrates of magnesium oxide (MgO) with (100) orientation are faced to the respective targets by a distance of about 50 centimeters, and the sputtering is carried out at 0.5 amperes and about 500 volts. On the respective substrates are deposited thin superconductive oxide film each of which is about two microns thick and of the bismuth-calcium-strontium-copper oxide system. The critical temperatures are measured by using a four probe method. The results are also indicated in Table 2.

TABLE 2

| Sample | Bi (volume %) | Thermal conductivity, (Cal/cm · sec °C.) | Electric resistivity, ($10^{-6}$ ohm · cm) | Flexural strength (kg/cm$^2$) | Critical temp. (Kelvin) |
|---|---|---|---|---|---|
| 1 (S) | 41 | $8 \times 10^{-3}$ | 300 | 560 | 76 |
| (H) | 41 | $10 \times 10^{-3}$ | 330 | 560 | 73 |
| 2 (S) | 36 | $7 \times 10^{-3}$ | 350 | 300 | 77 |
| (H) | 35 | $8 \times 10^{-3}$ | 330 | 310 | 75 |
| 3 (S) | 16 | $3 \times 10^{-3}$ | 750 | 250 | 78 |
| (H) | 16 | $2 \times 10^{-3}$ | 900 | 260 | 76 |
| 4 (S) | 26 | $5 \times 10^{-3}$ | 460 | 300 | 72 |
| (H) | 26 | $6 \times 10^{-3}$ | 500 | 290 | 74 |
| 5 (S) | 37 | $8 \times 10^{-3}$ | 330 | 350 | 76 |
| (H) | 37 | $7 \times 10^{-3}$ | 300 | 350 | 77 |
| 6 (S) | 34 | $7 \times 10^{-3}$ | 360 | 330 | 76 |
| (H) | 34 | $6 \times 10^{-3}$ | 400 | 320 | 74 |
| PA | None | $1 \times 10^{-5}$ | 7800 | 116 | Impossible by the DC system |

S and H in Table 2 stand for the sintering and the hot pressing, respectively, and PA indicates the target produced through the prior art process.

As will be understood from Table 2, the targets produced in accordance with the present invention are improved in the thermal conductivity, the electric resistivity and the flexural strength. These desirable properties are achieved by the metal bismuth impregnated. By virtue of the low electric resistivity, the targets of the present invention are sputtered by the DC magnetron sputtering system, however, the prior art target is hardly sputtered by the DC system. The targets of the present invention are usable for prolonged time periods without any cracks, so that the thin superconductive film is decreased in the production cost.

The thin superconductive films produced with the target of the present invention have a high critical temperature due to a negligible amount of carbon contained.

Although particular embodiments of the present invention have been shown and described, it will be obvious to those skilled in the art that various changes and modifications may be made without departing from the spirit and scope of the present invention.

What is claimed is:

1. A process of fabricating a target used in a sputtering system, comprising the steps of:
    a) preparing ingredient powders of a calcium carbonate, a strontium carbonate and a copper oxide;
    b) producing a porous bulk body of a complex oxide from said ingredient powders, said complex oxide being of the calcium-strontium-copper oxide system, by mixing said ingredient powders to a predetermined proportion to produce a mixture, calcining said mixture to produce said complex oxide, pulverizing said complex oxide to produce a powder of said complex oxide, pressurizing the powder of said complex oxide to produce a bulk body of the powder of said complex oxide, and sintering said bulk body of the powder of said complex oxide to produce a porous bulk body of said complex oxide; and
    c) impregnating molten bismuth into the porous bulk body of said complex oxide.

2. A process of fabricating a target used in a sputtering system as set forth in claim 1, in which said ingredient powders are about 7 microns in average diameter.

3. A process of fabricating a target used in a sputtering system as set forth in claim 1, in which said mixture is formed in moisture by using a ball-mill for about three hours.

4. A process of fabricating a target used in a sputtering system as set forth in claim 1, in which the calcining is carried out at about 860 degrees to about 1050 degrees centigrade.

5. A process of fabricating a target used in a sputtering system as set forth in claim 1, in which said pulverizing is carried out by using a ball-mill.

6. A process of fabricating a target used in a sputtering system as set forth in claim 1, in which the powder of said complex oxide has an average diameter ranging between about 3.0 microns and about 13 microns.

7. A process of fabricating a target used in a sputtering system as set forth in claim 1, in which said pressurizing is carried out at about two tons per square centimeter by using a pressing machine.

8. A process of fabricating a target used in a sputtering system as set forth in claim 1, in which said sintering is carried out at about 800 degrees to about 1040 degrees centigrade for about five hours.

9. A process of fabricating a target used in a sputtering system as set forth in claim 1, in which said impregnating step includes placing a bismuth film on said porous bulk body of said complex oxide and heating said bismuth film to or over a melting temperature thereof.

10. A process of fabricating a target used in a sputtering system as set forth in claim 9, in which said melting temperature is about 272 degrees centigrade.

11. A process of fabricating a target used in a sputtering system as set forth in claim 1, in which the pressurizing and sintering steps are carried out by hot pressing.

12. A process of fabricating a target used in a sputtering system as set forth in claim 11, in which said hot pressing is carried out at about 550 degrees to about 980 degrees centigrade.

13. A process of fabricating a target used in a sputtering system as set forth in claim 11, in which said hot pressing is carried out in a vacuum.

14. A process of fabricating a target used in a sputtering system as set forth in claim 11, in which said hot pressing is carried out in argon.

15. A process of fabricating a target used in a sputtering system as set forth in claim 11, in which said impregnating step includes placing a bismuth film on said porous bulk body of said complex oxide and heating said bismuth film to or over a melting temperature thereof.

* * * * *